United States Patent
Manganaro

(10) Patent No.: US 10,027,447 B2
(45) Date of Patent: Jul. 17, 2018

(54) CIRCUITS FOR ON-SITU DIFFERENTIAL IMPEDANCE BALANCE ERROR MEASUREMENT AND CORRECTION

(71) Applicant: Analog Devices, Inc., Norwood, MA (US)

(72) Inventor: Gabriele Manganaro, Winchester, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 15/673,064

(22) Filed: Aug. 9, 2017

(65) Prior Publication Data

US 2018/0109361 A1    Apr. 19, 2018

Related U.S. Application Data

(60) Provisional application No. 62/409,062, filed on Oct. 17, 2016.

(51) Int. Cl.

| | |
|---|---|
| H04B 3/46 | (2015.01) |
| H04L 1/20 | (2006.01) |
| G01R 31/36 | (2006.01) |
| G01R 27/04 | (2006.01) |
| H03M 1/08 | (2006.01) |
| H03M 1/74 | (2006.01) |

(52) U.S. Cl.
CPC ............. *H04L 1/20* (2013.01); *G01R 27/04* (2013.01); *G01R 31/3624* (2013.01); *G01R 31/3648* (2013.01); *H03M 1/0845* (2013.01); *H03M 1/742* (2013.01)

(58) Field of Classification Search
CPC . H04B 3/487; H04L 25/0278; H04L 25/0298; H04L 25/085; H04L 25/0272; H04L 1/24; H04L 25/0276; H01R 2201/20; H03F 3/45479; H03F 3/343; H03H 11/04; H03H 11/28; H03H 7/383
See application file for complete search history.

(56) References Cited

U.S. PATENT DOCUMENTS

| | | | |
|---|---|---|---|
| 4,182,024 | A | 1/1980 | Cometta |
| 6,472,897 | B1 | 10/2002 | Shyr et al. |
| 2002/0159548 | A1 | 10/2002 | Evans et al. |

(Continued)

OTHER PUBLICATIONS

Application Note, *Differential Impedance Measurements with the Tektronix 80008 Series Instruments*, www.tektronix.com/oscilloscopes, 8 pages, © 2003.

(Continued)

*Primary Examiner* — Rahel Guarino
(74) *Attorney, Agent, or Firm* — Patent Capital Group

(57) ABSTRACT

Circuits are used to sense and compensate or mitigate the imbalance errors, hence restoring the intended benefits of differential processing. In particular, the impedance mismatch between the positive and negative branches of a balanced system is sensed by digitizing an error voltage developed by injecting suitable common mode stimuli. The mismatch is then trimmed out by introducing and properly setting up a digitally controlled impedance that counters the original impedance mismatch and hence rebalances the signal path on-situ and prior to exercising the signal processing chain.

20 Claims, 9 Drawing Sheets

(56) References Cited

U.S. PATENT DOCUMENTS

| 2004/0158167 | A1* | 8/2004 | Smith | A61B 5/053 |
| | | | | 600/547 |
| 2005/0057276 | A1 | 3/2005 | Washburn et al. | |
| 2007/0066269 | A1 | 3/2007 | Kivekas et al. | |
| 2011/0268258 | A1 | 11/2011 | Alloin et al. | |
| 2015/0214911 | A1 | 7/2015 | Johnson et al. | |

OTHER PUBLICATIONS

*Differential Impedance TDR Probes for the DSA8300, P80318, P80318X Data Sheet*, www.tektronix.com, 2 pages, © Apr. 28, 2011.
Eric Bogatin et al., *Differential Impedance Measurement with Time Domain Reflectometry*, Application Note 1382-5, Agilent Technologies, 18 pages, © 2002.
Application Note, *Measuring Differential Impedances with a Two-Port Network Analyzer*, Maxim Integrated, 4 pages, May 1, 2002.
Douglas Brooks, *Differential Impedance, What's the Difference?*, 2 pages, © 1998.
Eric Bogatin, *Differential Impedance . . . finally made simple*, 25 pages, © 2000.
Christian C. Enz et al., *Circuit Techniques for Reducing the Effects of Op-Amp Imperfections: Autozeroing, Correlated Double Sampling, and Chopper Stabliation*, Proceedings of the IEEE, vol. 84, No. 11, Nov. 1996, 31 pages.
Jim Karki, *Input Impedance Matching with Fully Differential Amplifiers*, Texas Instruments Incorporated, High-Performance Analog Products, Analog Applications Journal, 8 pages, © 20008.
Search Report issued in EP Patent Application Serial No. 17106031.3 dated Mar. 5, 2018, 8 pages.

\* cited by examiner

US 10,027,447 B2

CIRCUITS FOR ON-SITU DIFFERENTIAL IMPEDANCE BALANCE ERROR MEASUREMENT AND CORRECTION

PRIORITY DATA AND RELATED APPLICATIONS

This patent application receives benefit from and/or claim priority to U.S. Provisional Patent Application Ser. No. 62/409,062, filed on Oct. 17, 2016, entitled "CIRCUITS FOR ON-SITU DIFFERENTIAL IMPEDANCE BALANCE ERROR MEASUREMENT AND CORRECTION". This U.S. Provisional Patent Application is incorporated by reference in its entirety.

TECHNICAL FIELD OF THE DISCLOSURE

The present invention relates to the field of integrated circuits, in particular to circuits for on-situ differential impedance balance error measurement and correction.

BACKGROUND

In a balanced circuit, signals can be transmitted between two points over two signal lines, generally referred to as the positive and negative branches of the balanced circuit. The two signal lines help reject noise which affects both signal lines, because a difference between the two signal lines at the receiving point can ideally recover the original signal and remove the noise. Mismatches between the nominally identical positive and negative branches of balanced circuits introduce degradation in a differential signal processing system. The imbalance causes a number of problems, including incomplete cancellation of even-order circuit non-linearity and incomplete cancellation of any common mode (undesired) signal in the differential signal path.

BRIEF DESCRIPTION OF THE DRAWINGS

To provide a more complete understanding of the present disclosure and features and advantages thereof, reference is made to the following description, taken in conjunction with the accompanying figures, wherein like reference numerals or labels represent like parts, in which.

DESCRIPTION OF EXAMPLE EMBODIMENTS OF THE DISCLOSURE

Overview

Figure 1:
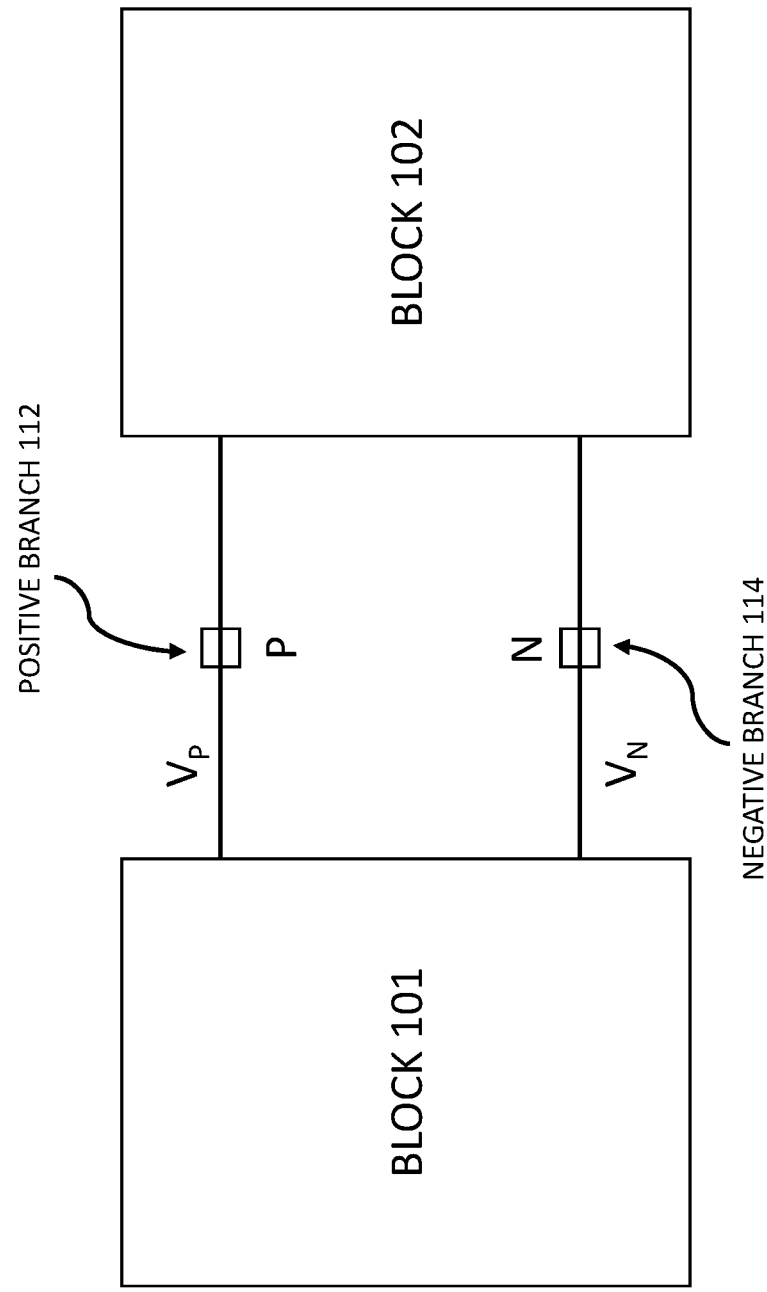
FIG. 1 illustrates a signaling interface between two mixed-signal processing blocks, according to some embodiments of the disclosure.

Circuits can be provided to sense and compensate or mitigate the imbalance error to restore the intended benefits of differential processing. In particular, the impedance mismatch between the positive and negative branches of a balanced system is sensed by digitizing an error voltage developed by injecting suitable common mode stimuli. The mismatch is then trimmed out by introducing and properly setting up a digitally controlled impedance that counters the original impedance mismatch and rebalances the signal path on-situ and prior to exercising the signal processing chain. On-situ, as used herein, is meant to encompass a state of the electronics after the electronics have been mounted, assembled, and coupled together, e.g., interconnected on a printed circuit board, but just before the electronics are put into normal operation.

Understanding Impedance Balance

Impedance balance between the positive and negative branches in differential signaling mixed-signal processing systems allows for the cancellation of several sources of even-order nonlinearity as well as the cancellation of common mode (sometimes undesired) signal in the differential signal paths. Herein, the positive and negative branches can also be referred to as the differential signal paths or positive and negative signal paths of a balanced/differential circuit. Some amount of mismatch between the positive and negative branches, often due to manufacturing limits (in circuits and devices otherwise meant to be fabricated balanced), is however inevitable. The resulting performance degradation is directly proportional to the amount of mismatch error.

In practice, without explicit recourse to (possibly costly) engineering techniques and associated development time, most manufactured circuit boards and passive components lead to balanced systems with mismatch of the order of 1% to 0.1% between the positive and negative ends at the interfaces between functional blocks. Lacking such targeted engineering effort, for example, the resulting linearity performance of signal processing chains including integrated circuits (ICs), such as (but not limited to) analog-to-digital converters (ADCs) and digital-to-analog converters (DACs) meant to otherwise deliver linearity performance in excess of, say, 10 b (i.e., $\frac{1}{2}^{10}$~0.1% or, equivalently, 62 dB and above) would be limited to lower performance. Once again, this is particularly problematic "on-situ", namely on a printed circuit board (PCB) once all components of an electronic system are mounted and the resulting assembled signal chain is about to be operated for signal processing.

Different classes of circuits and circuit techniques, known as auto-zero, trimming and calibration, are available to sense and compensate for various sources of mismatch and to compensate for the resulting performance limitations. For example, the mismatch between the input devices (bipolar or junction gate field-effect transistor) of differential pairs is corrected by laser trimming the devices themselves. In another example, effect of mismatches in an on-chip reference is trimmed by injecting a correction current by means of a DAC. The chosen trim current amount is stored on-chip by burning on-chip fuses. The trim sequence must be performed during production testing on the IC tester. In yet another example, a radio frequency mixer is linearized by introducing imbalance on its output load.

Modeling Impedance Mismatch and Possible but Limited Ways to Address Impedance Mismatch A balanced signaling interface between two mixed-signal processing blocks (or circuit blocks) is shown in FIG. 1. Block 101 and Block 102 represent the two processing blocks respectively. These are connected to each other with a balanced two-terminal port marked with P and N respectively (called PN port herein). The connection via the PN port forms an ideally balanced circuit comprising a positive branch 112 and negative branch 114. Each branch has a node potential (or voltage) referenced to ground marked as $V_p$ and $V_N$ respectively. When differential signaling is used, the differential signal at this port is $V_{in}=V_p-V_N$ while the common mode signal is $V_{incm}=(V_p+V_N)/2$. Assuming perfect balance and perfect differential signal generation, $V_{incm}$ is a direct current (DC) signal.

Figure 2:
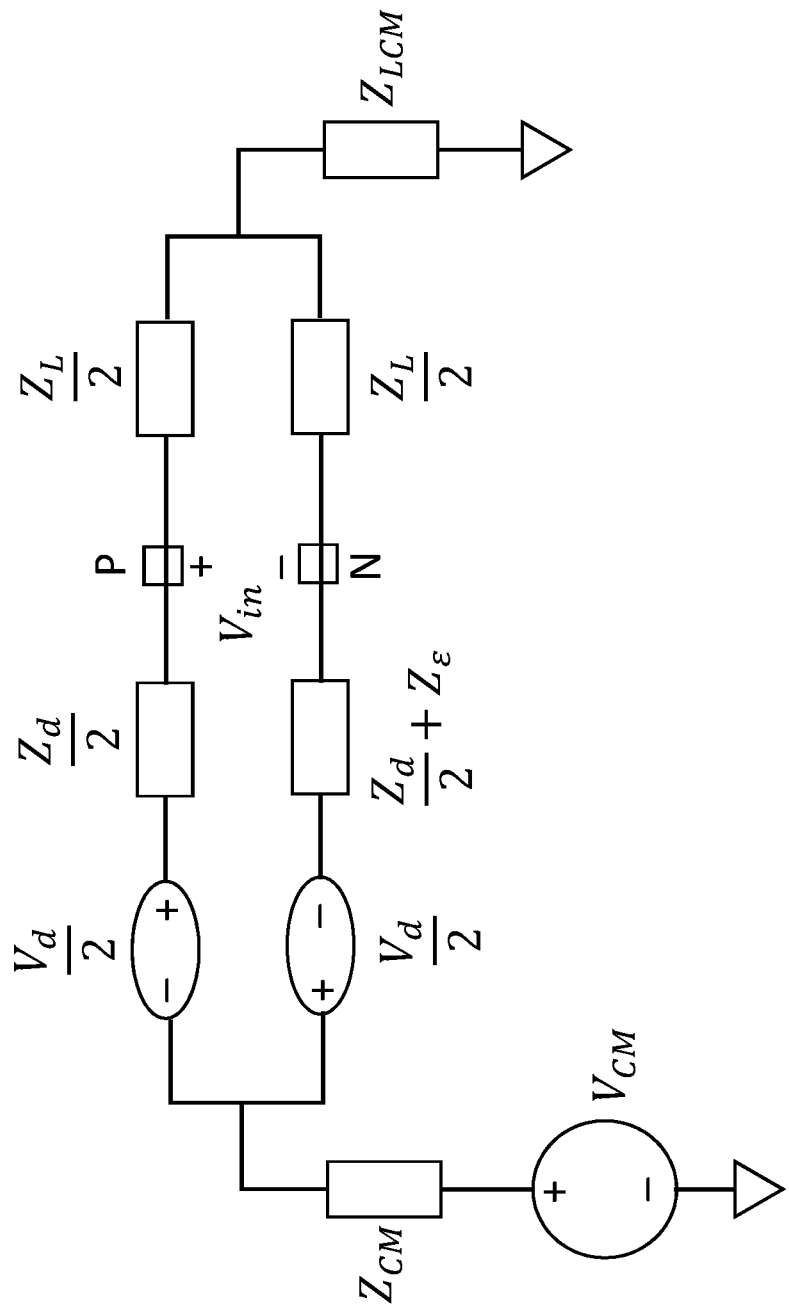
FIG. 2 illustrates the signaling interface between two mixed-signal processing blocks with Thevenin equivalent models, according to some embodiments of the disclosure.

Suppose Block 101 is sourcing a signal to Block 102 so the latter can process sourced signal. In this case, a linear representation of Block 101 and Block 102 using balanced Thevenin equivalent models is depicted in FIG. 2. In the circuit model shown, the left hand side of the port PN has:

The common mode voltage source $V_{cm}$, with its equivalent common mode differential impedance $Z_{cm}$, The differential signal source $V_d$ split into two half signal sources, each one of magnitude $V_d/2$, one for each differential branch, and each one of them is series-connected with half of the differential impedance $Z_d$, The differential impedance mismatch component has been lumped, for the entire port, into an impedance $Z_\varepsilon$ of unknown phase and magnitude. The differential impedance mismatch component has been modeled as an additive contribution to the negative half differential impedance $Z_d/2$. It could have been added to the other half (positive half) differential impedance; but since its phase is unknown, for the sake of discussion, it has been added to the bottom half (negative half) differential impedance.

Since all the differential impedance mismatch has been lumped to the Thevenin's equivalent circuit on the left side of PN, the model of Block 102 can be simplified in to the network load model on the right hand side of PN, composed of a common mode impedance load $Z_{LCM}$ and two half differential load impedances $Z_L/2$.

The positive branch impedances has $Z_d/2$ and $Z_L/2$ in series. The negative branch has impedances $Z_d/2+Z_\varepsilon$ and $Z_L/2$ in series.

In a perfectly balanced network where $Z_\varepsilon=0$, $V_{in}=V_d*Z_L/(Z_L+Z_d)$. But when an imbalance exists, then $Z_\varepsilon<or>0$, $V_{cm}$ would be contaminated with a distorted $V_d$, and some amount of this common mode signal $V_{cm}$ would appear superimposed on to the differential input $V_{in}$. Herein, this undesired component is referred to as the common mode "leak" voltage, which is proportional to the amount of mismatch $\varepsilon=f(Z_\varepsilon)$. The undesired component can degrade $V_{in}$:

$$V_{in}=V_d*Z_L/(Z_L+Z_d)+\varepsilon V_{cm} \quad (1)$$

The $V_{cm}$ term, i.e., $\varepsilon V_{cm}$, carries/introduces even-order distortions on $V_{in}$ and the term can also cause even more distortions, down the signal chain, $V_{in}$ as in equation (1) exercises Block 102.

Figure 3:
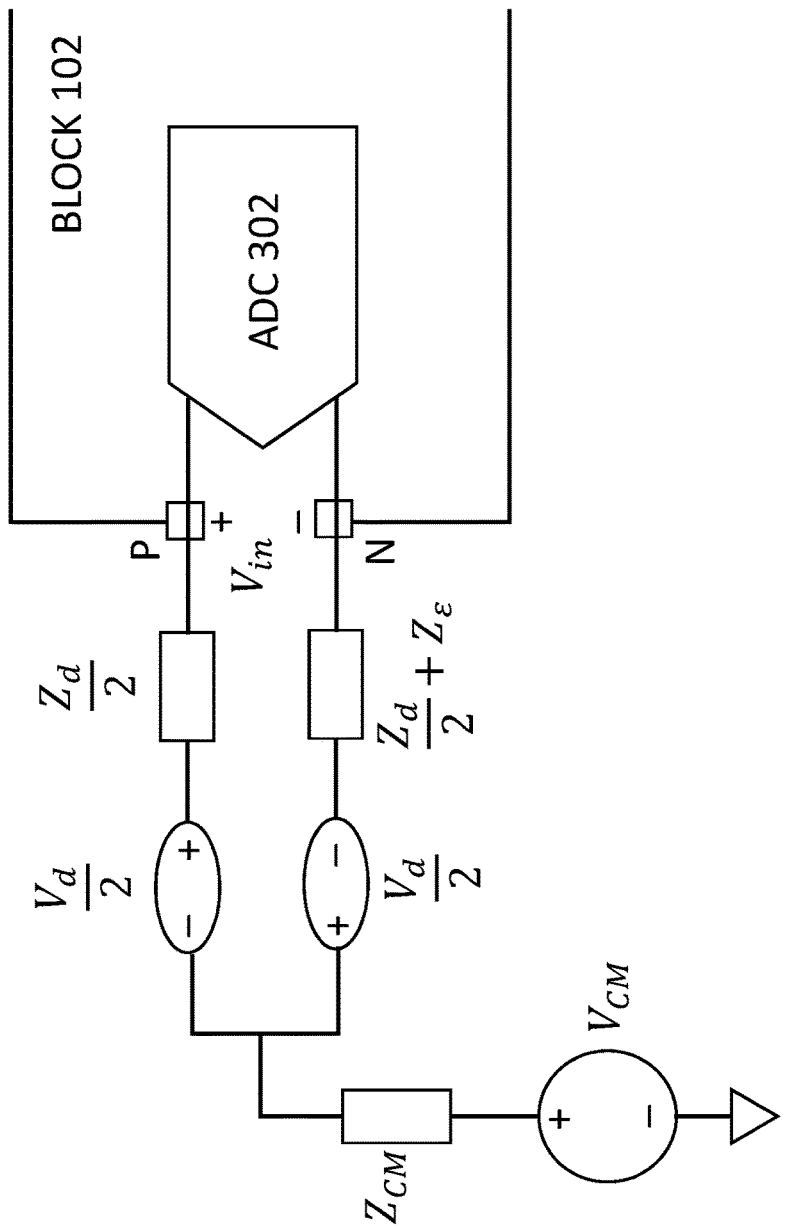
FIG. 3 illustrates the signaling interface between two mixed-signal processing blocks where one of the blocks is an analog-to-digital converter, according to some embodiments of the disclosure.

In one embodiment, as depicted in FIG. 3, the load network models the input front-end circuitry of an ADC 302. In this case, Block 102 embodies the ADC 302 and any accompanying front-end circuitry on-chip with the ADC. The ADC resides in a packaged IC and its input front-end circuitry is designed and manufactured to be sufficiently balanced for the desired final distortion performance. However, the off-chip network driving the ADC input (e.g., in Block 101), typically including a passive/discrete input filter (anti-aliasing and/or roofing/conditioning filters), is unlikely to meet the same degree of impedance balance. The off-chip network is instead subject to both manufacturing imperfections as well as systematic/design imperfections depending, for example, on the shape and routing of the interconnects in the PCB and of their surroundings. A common remedy to such uneven driving impedance condition can include introducing a high performance balun at the input of the ADC 302, where the balun's carefully balanced output winding drives the ADC input. But high performance wideband linear baluns can be bulky and costly and can, in fact, be relatively band-limited (more than the remaining signal chain).

In another embodiment of the model and general impedance mismatch problem, an integrated DAC drives an off-chip load, such as a reconstruction filter. In this case, Block 101 embodies the integrated DAC, Block 102 embodies the filter, the mismatch impedance $Z_\varepsilon$ can be lumped to one of the two branches of the differential load network model for Block 102 (instead of the source impedance of Block 101). The mismatch impedance can be added to a corresponding $Z_L/2$ instead of $Z_d/2$ (as seen in FIG. 2). For simplicity, various embodiments refer to the model described in FIG. 2 where the network unbalance $Z_\varepsilon$ is lumped to the driving Block 101. One skilled in the art would appreciate that the various teachings herein can also be applied to a case described above (where the mismatch impedance $Z_\varepsilon$ is lumped to one of the two branches of the differential load network model for Block 102).

Technique for Measuring and Mitigating Impedance Mismatch

Circuits and techniques can be implemented to mitigate the impedance mismatch between the positive and negative branches at the interface between two, otherwise balanced, mixed-signal functional blocks (or two mixed-signal circuit blocks). The circuits and techniques sense the mismatch in impedance and compensate (on-situ and prior to exercising the signal chain) for the sensed mismatch by setting up a digitally controlled impedance array. The array adds sufficient impedance load to the branch that is otherwise originally deficient to significantly reduce the resulting mismatch without (or with minimal) recourse to further, time consuming and costly, traditional engineering development. Various embodiments disclosed herein aim at adapting to $Z_\varepsilon$ and cancelling its effect so as to make c as close as possible to zero in equation (1).

Figure 4:
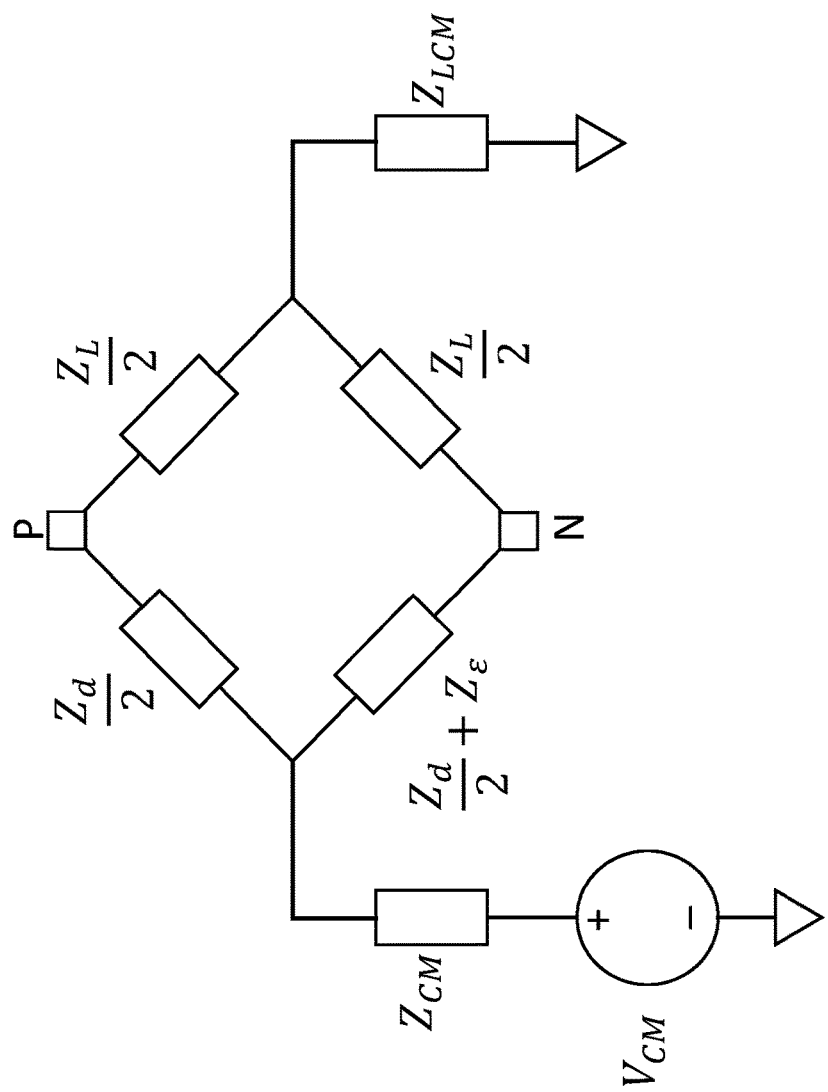
FIGS. 4 and 5 are redrawn versions of the illustration in FIG. 2, according to some embodiments of the disclosure.
Figure 5:
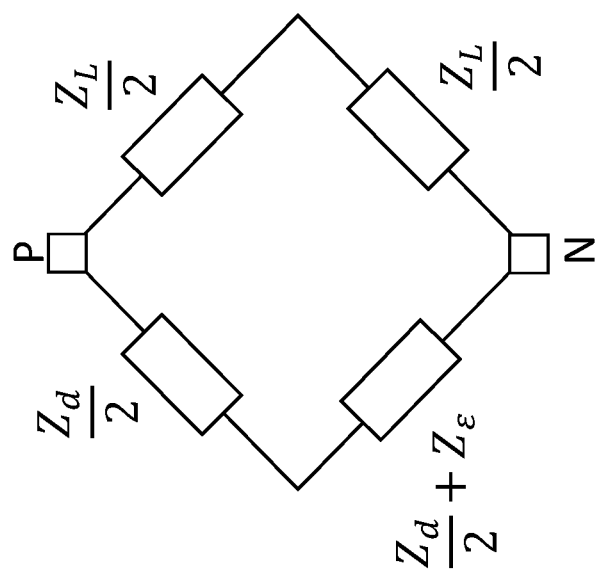

The circuit in FIG. 2 can be redrawn and simplified as in FIG. 4 after zeroing the differential signal $V_d$. Its corresponding differential impedance network can, in turn, be redrawn as seen in FIG. 5. This network seen in FIG. 5 modifies the network seen in FIG. 4 by inserting a digitally trimmable impedance $Z_T$ 602 in series with the load impedance $Z_L/2$ 604 on the same negative branch where the mismatch $Z_\varepsilon$ has been previously modeled. Furthermore, a stimulus test source $V_T$ 608 is applied to the common mode nodes N1 and N2 on the left and right hand sides of the network respectively, and a (conceptual) voltmeter $V_\varepsilon$ 606 is introduced to the PN port to measure or probe $V_{in}=V_p-V_N$. The resulting network is depicted in FIG. 6.

Figure 6:
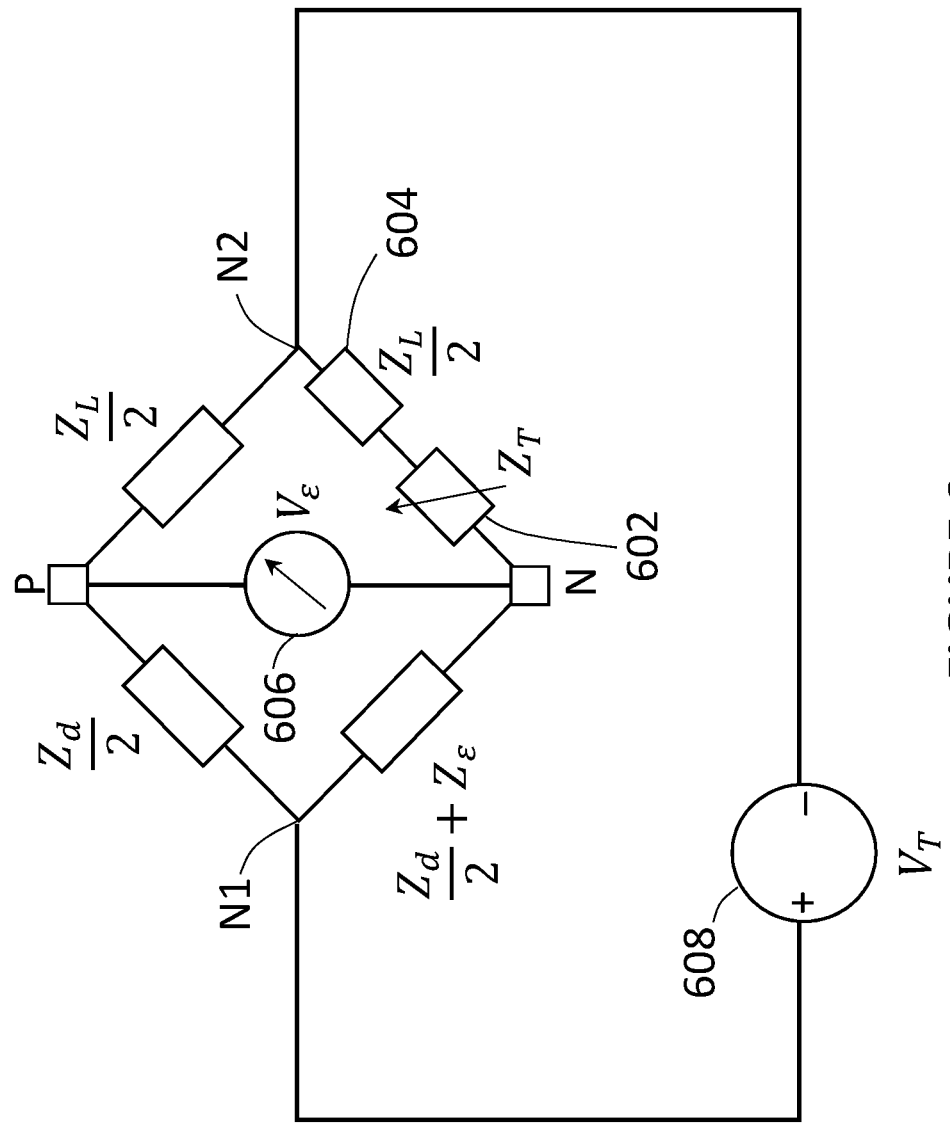
FIG. 6 illustrates a Wheatstone bridge structure.

The network shown in FIG. 6 has a Wheatstone bridge structure. If this bridge is unbalanced, applying the (common mode) test voltage stimulus $V_T$ 608 at common mode nodes N1 and N2 would result into a measurable non-zero (differential) voltage $V_\varepsilon$ consistently with what previously predicted by equation (1) in the case of zero differential source stimulus. From a practical standpoint, it is important to emphasize the high precision/sensitivity of this measurement set up. As we vary $Z_T$ 602, the voltmeter 606 would correspondingly display a varying voltage read out resulting from the stimulus $V_T$ 608 and proportionally to the amount of differential network unbalance. The balance condition for this bridge, namely, the condition in which the voltmeter $V_\varepsilon$ read out is zero volts is:

$$\frac{Z_T + Z_L/2}{Z_\varepsilon + Z_d/2} = \frac{Z_L/2}{Z_d/2} \quad (2)$$

This can be solved for $Z_T$:

$$Z_T = Z_\varepsilon \frac{Z_L}{Z_d} \quad (3)$$

This equation provides two important considerations. First of all, one can zero out the common mode leak appearing as $V_\varepsilon$ by suitably adjusting $Z_T$ 602 to rebalance the network against $Z_\varepsilon$. In other words, it is possible to vary $Z_T$ 602 to compensate for the impedance imbalance. Second, since for maximum voltage transfer from the source Block 101 to the payload Block 102, ICs are normally designed to have $|Z_L| \gg |Z_d|$, then applying this condition to equation (3), a very small $Z_\varepsilon$ can be practically zeroed with a practically higher $Z_T$. This means that small, hard to detect, mismatches $Z_\varepsilon$ can be compensated with large and possibly inaccurate $Z_T$.

However, in applications where impedances are matched to accomplish maximum power transfer (as opposed to maximum voltage transfer), then $Z_L = Z_d$ and therefore $|Z_T| = |Z_\varepsilon|$. In such cases, the trimmable part of $Z_T$ 602 can be implemented with large value passive components but the complete network implementation of $Z_T$ may benefit from using controlled impedance-scaling sections analogously to what is done, for instance, in successive approximation (SAR) ADC's capacitive DACs with double-arrays.

$Z_\varepsilon = R_\varepsilon + jX_\varepsilon(f)$ is a frequency dependent complex number. Determining the $Z_T$ 602 that satisfies equation (3) and that zeroes the effect of the mismatch can effectively be done separately and independently for the real (resistive) and imaginary (reactive) components.

To determine the resistive component of $Z_T$ 602, it is possible to use a DC voltage as a stimulus $V_T$ 608. As described, with a non-zero DC value for $V_T$ 608, the voltmeter $V_\varepsilon$ 606 will be non-zero. In this condition, all impedances behave as resistances, so $Z_\varepsilon = R_\varepsilon$ and $Z_T = R_T$. As such, the algorithm to search for $R_T$ can be a classic binary search (e.g., similar to what is performed by SAR ADCs) aiming to zero out $V_\varepsilon$. This finds $R_T$ in, at most, N steps (with N being the number of bits controlling $R_T$). Other algorithms can be used to determine the resistive component.

To determine the reactive component $X_T(f)$ of $Z_T$ 602, it is possible to use an alternating current (AC) stimulus, e.g., sine wave, with zero DC component for $V_T$ 608, choosing f suitably to the intended frequency operation of the differential circuit formed by Block 101 and 102. For practical reasons, it is appropriate to assume that $X_T(f)$ is implemented with a bank of capacitors, and that $X_T(f)$ would be positive. $V_\varepsilon$ will be non-zero until the bridge is again balanced (satisfying equation 3, with all real components already determined). Once again a binary search algorithm or other suitable search algorithm can be used to determine $X_T(f)$. In some cases, the reactive component $X_T(f)$ of $Z_T$ 602 is determined once the resistive component of $Z_T$ 602 is determined.

Placing $Z_T$ 602 on the negative branch of the port would eventually lead to a finite non-zero resistive value $R_T$ for the impedance that rebalances the bridge at DC. This implicitly assumes that the resistive mismatch to be nulled corresponds to more resistance on the negative branch than in the positive branch. Indeed, that might not be true (in fact, it is likely to be true only with 50% probability if the mismatch is characterized by a Gaussian error distribution). So if the positive branch has in fact more resistive component than the negative branch, then a $Z_T$ placed on the negative branch should in principle be able to emulate a negative resistance to be able to restore balance. While the latter is, in principle, completely possible by resorting to the use of active components, in the implementation of $Z_T$, it can be far easier and practical to address the issue and generalize the scheme in a different manner. Specifically, the issue can be resolved by introducing a small resistor, on the positive branch, to the right hand side of P, just like the previously inserted $Z_T$ in the negative branch on the right hand side of node N of the PN port. By doing so, since the resistive differential mismatch $R_\varepsilon$ is a small parasitic, the introduction of this artificial positive mismatch forces the negative branch to be excessive in resistance in all cases. So while the amount of the mismatch $R_\varepsilon$ is still unknown and needs to be corrected as described above, one can be certain that it will be a net positive resistive amount ($R_\varepsilon > 0$) and the scheme can arrive to a final positive $R_T$ solution.

An analogous extension can be made for the case in which $X_\varepsilon(f) < 0$. The latter would occur if either (1) $X_\varepsilon(f)$ is inductive at f, or, if (2) there is a higher reactive mismatch on the positive branch of FIG. 6, instead of the assumption for $Z_\varepsilon$ to be in the negative branch. Either way, just like in the case in which we introduced a small offset on the resistive mismatch by adding a small resistor on the positive branch, it is possible to force the reactive mismatch to lead to $X_\varepsilon(f) > 0$ in all cases by shunting the small resistor on the positive branch with a small capacitor. In such a case, the assumption of resistive and capacitive excess impedance on the negative branch are always met and the implementation of $X_T(f)$ using a bank of resistors and capacitors and the placement of $Z_T$ in the negative branch is not limiting and the disclosed approach equally leads to the mismatch compensation.

Figure 7:
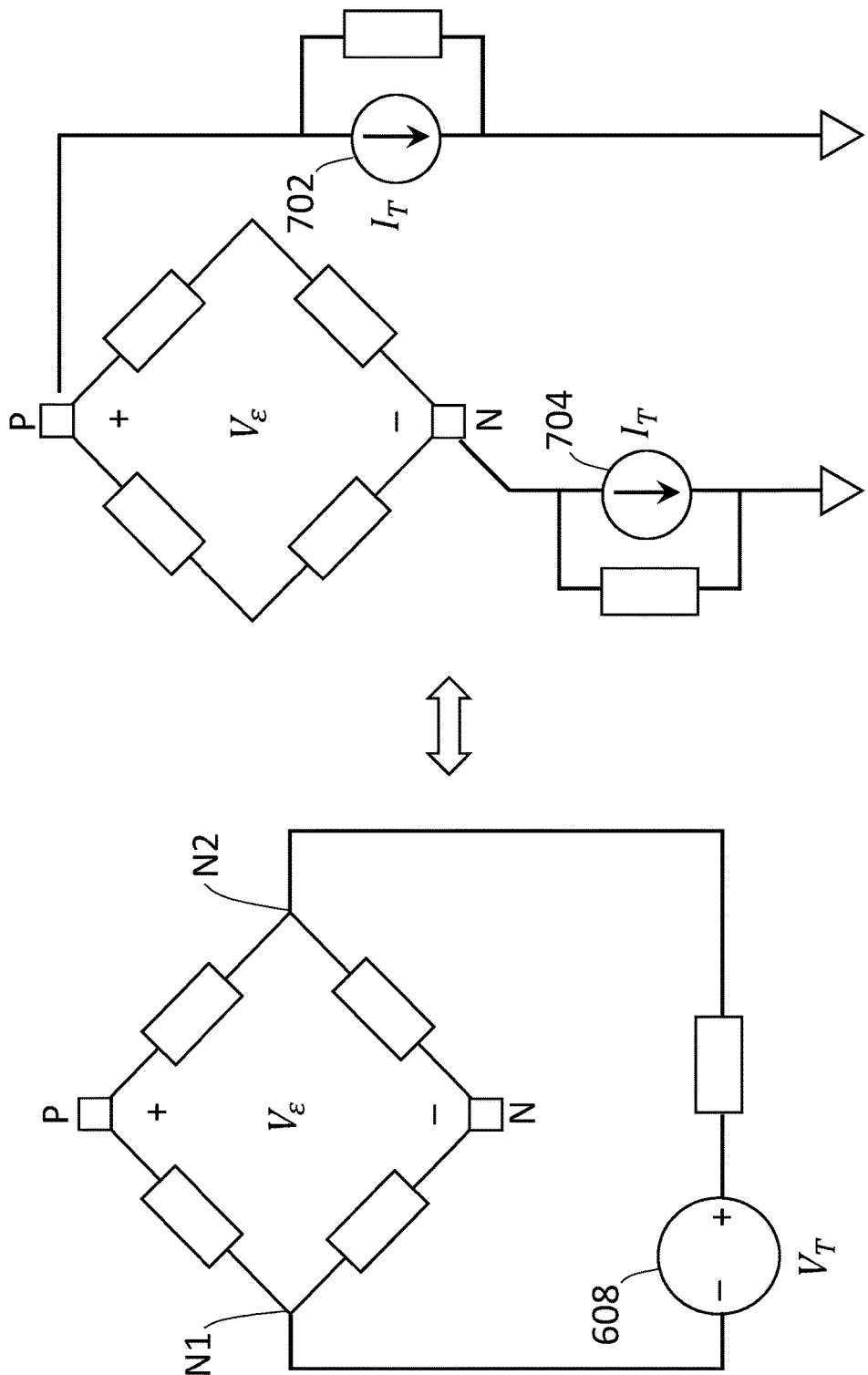
FIG. 7 illustrates a circuit transformation, according to some embodiments of the disclosure.

FIG. 7 illustrates a circuit transformation, but does not show a network equivalence. Rather, FIG. 7 shows an alternate and equivalent way in which a common mode stimulus on the PN port of our bridge network can be exercised. Again, the task is to develop an error voltage $V_\varepsilon$ at the differential port as result of a common mode excitation and an existing impedance imbalance. Such error voltage can be completely zeroed once the bridge is rebalanced as described above.

As discussed previously, for the scheme in the left hand side of FIG. 7, $V_T$ 608 forces a difference in common mode between the left and right sides of the bridge at nodes N1 and N2. If the bridge is balanced, namely if the impedances result into perfect balance at the PN port (nodes P and N), then both $V_P$ and $V_N$ experience the same identical shift in common mode and $V_\varepsilon$ is zero. But if the impedances are not differentially balanced, then there will be a difference in common mode between $V_P$ and $V_N$ at nodes P and N respectively and that would lead to a non-zero $V_\varepsilon$. The same effects will be equivalently seen on the bridge shown in the right hand side of FIG. 7. Namely, the scheme directly forces the common mode voltage of the PN port by using two identical current stimulus sources $I_T$ 702 and 704 coupled to nodes P and N. Again, if the bridge is balanced, both $V_P$ and $V_N$ will see the same identical common mode shift and hence $V_\varepsilon$ is zero. But if the impedances are not differentially balanced, then there will be a difference in common mode between $V_P$ and $V_N$ and that will lead to a non-zero $V_\varepsilon$, which can be restored by introducing $Z_T$ (e.g., $Z_T$ 602 of FIG. 6) and following the rebalance procedure described above. Using this latter scheme with two identical current sources excitation provides an alternate scheme for measuring the impedance imbalance.

Digitally controllable resistors and capacitors, i.e., different embodiments for $Z_T$, can include switchable banks of either weighted or unary resistors and capacitors respectively.

Exemplary Implementations with Current-Based Common Mode Stimulus

Figure 8:
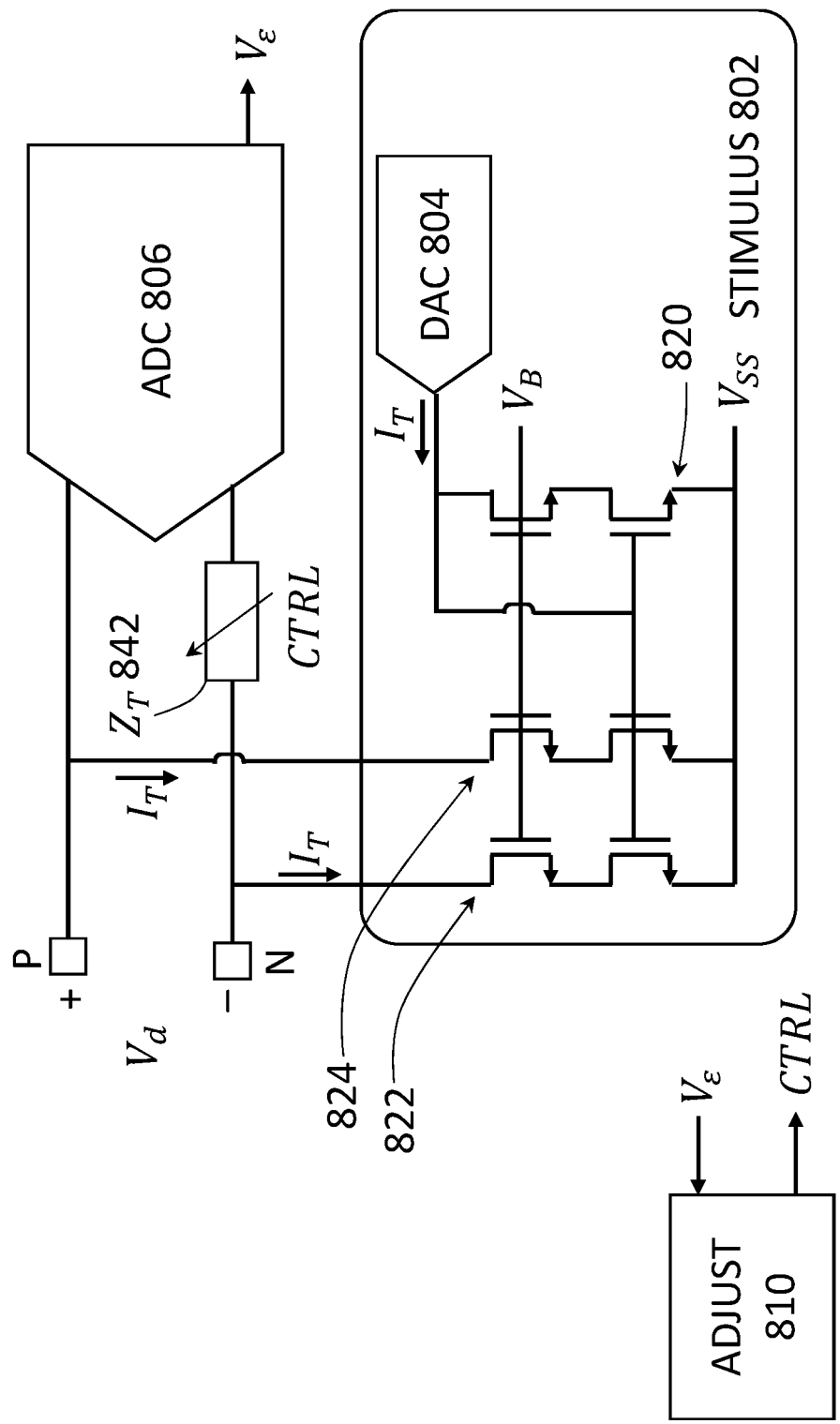
FIG. 8 illustrates an exemplary circuit for on-situ differential impedance balance error measurement and correction.

FIG. 8 shows a practical case in which a balanced ADC (considered to be part of Block 102 of FIG. 1) samples a differential input at the PN port. In order to correct for the impedance imbalance at the PN port, the digitally controlled impedance $Z_T$ 842 as well as the additional circuit marked, as "STIMULUS 802" in FIG. 8, are introduced. The digitally controlled impedance $Z_T$ 842 is provided on the negative branch of the differential circuit for illustration. An adjust logic block 810 can be included to generate a control signal CTRL (e.g., a digital word) to control or set the digitally controlled impedance $Z_T$ 842. The additional circuit shown as the stimulus 802 corresponds to an implementation of the dual current source stimulus described in FIG. 7. Specifically, the stimulus 802 comprises a current-output DAC 804 coupled to a main current branch 820, and two output branches 822 and 824 coupled to positive and negative branches of the differential circuit respectively. The DAC 804 generates a current $I_T$ that is identically mirrored on the two output branches 822 and 824, each output branch having a cascoded current mirror. The output branches 822 and 824 mirrors the current of the main current branch 820. These two identical currents $I_T$ are injected at nodes P and N to impose common mode stimulus to $V_P$ and $V_N$ at nodes P and N respectively just like in the scheme shown on the right of FIG. 7. The impedance imbalance can be compensated for as in FIG. 6.

Those skilled in the art would readily recognize that here a DAC, such as DAC 804, being a digitally controlled or variable current source, is not strictly required in order to proceed with setting $Z_T$ 602. A DC current source would suffice to set the resistive part of $Z_T$, and a sinusoidal current source can be used for setting the reactive part of $Z_T$. However, it is rather practical to accomplish the same by using a DAC since it can be readily available on-chip. Using a DAC also means that the amount of current to be injected for the stimulus can be varied to improve the measuring of impedance imbalance.

Digitally setting $Z_T$ 842, can be performed on-situ with the signal chain where the ADC 806 is meant to operate. Simply put, the network of FIG. 8 represents Block 102 and it is assumed that the signal chain is completed with the driving block, i.e., Block 101, in order for the compensation to take place. First, no differential signal ($V_d$=0) is applied to the PN port and the setting of $Z_T$ 842 can begin. The stimulus DAC 804 generates a non-zero current $I_T$ aimed to evidence the PN imbalance. If there is an imbalance and that develops as a non-zero $V_\varepsilon$, across nodes P and N, then a proportional non-zero input ($|V_d|>0$) will also be sampled at the direct input of the ADC 806. The ADC 806 itself in the signal chain can be used to detect the imbalance and to proceed with the scheme that sets $Z_T$ to compensate for the imbalance. In some cases, what really matters is not necessarily that PN port is perfectly balanced, but rather that the ADC 806 sees a balanced input despite any imbalance along the network feeding it. Advantageously, the ADC 806 works both as an imbalance detector for the compensation, it is also the ultimate beneficiary of the scheme. If the ADC 806 sees a balanced input, better performance of the signal chain can be achieved.

The digitally controlled impedance $Z_T$ 842 can be set up by the adjust logic block 810 using a suitable method, such as a binary search method as described above. Other efficient search methods can be used to determine and set the digitally controlled impedance $Z_T$ 842. With the proper setting for digitally controlled impedance $Z_T$ 842, i.e., the appropriate signal CTRL, impedance balance can be obtained. Once that is completed, the stimulus DAC 804 output is zeroed and the differential circuit is ready to be operated with non-zero differential signal $V_d$. It is clear that any imbalance introduced by the current injection at the PN port is bundled with other mismatches and compensated as well.

Figure 9:
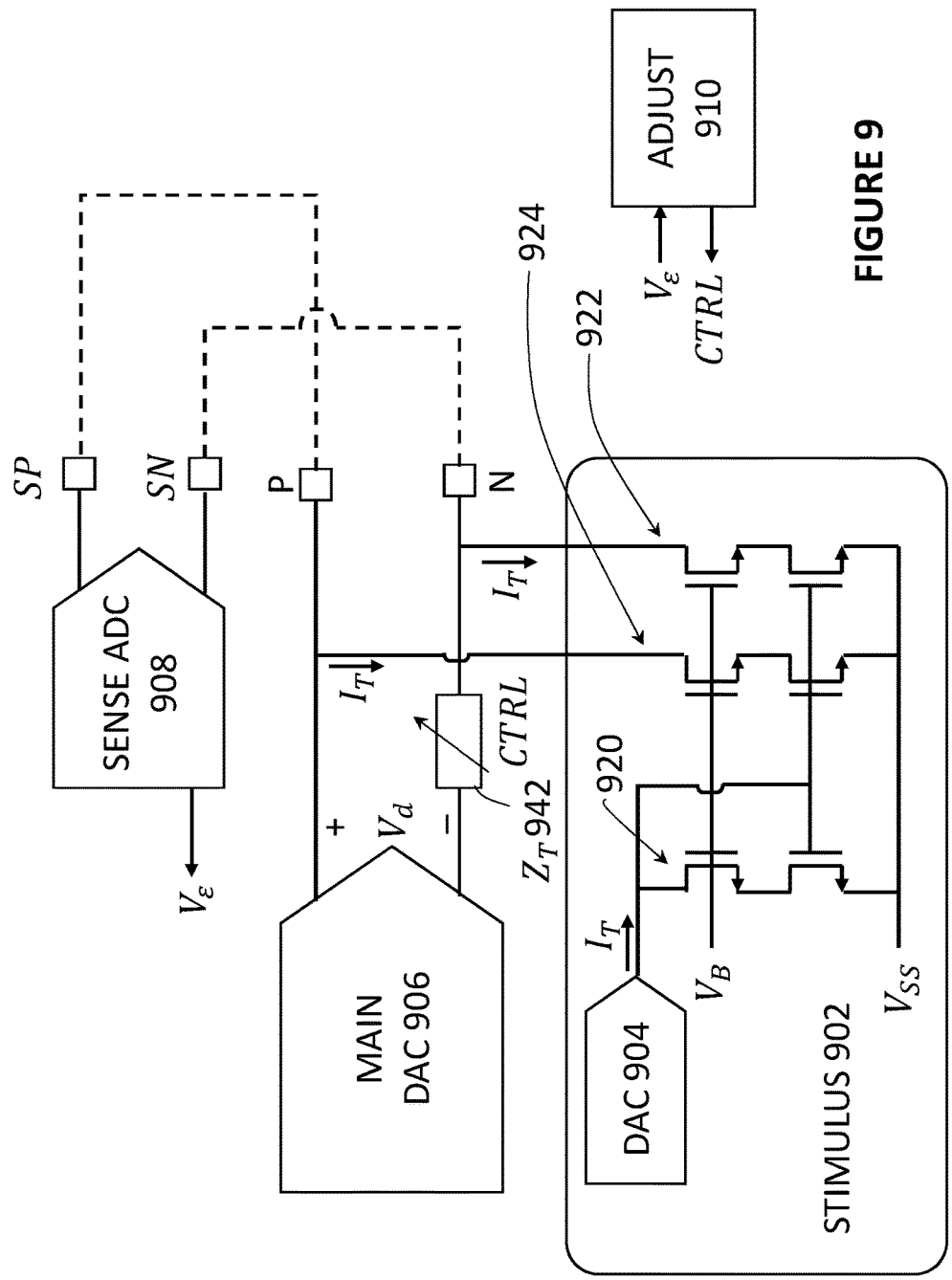
FIG. 9 illustrates another exemplary circuit for on-situ differential impedance balance error measurement and correction.

Another embodiment is illustrated in FIG. 9. In this case a main DAC 906 (considered to be Block 101 of FIG. 1), drives a subsequent stage (considered to be Block 102 of FIG. 1), not shown in the FIGURE, tied to the output port PN. The digitally controlled impedance $Z_T$ 942 is provided on the negative branch of the differential circuit for illustration. An adjust logic block 910 can be included to generate a control signal CTRL (e.g., a digital word) to control or set the digitally controlled impedance $Z_T$ 942. The additional circuit shown as the stimulus 902 corresponds to an implementation of the dual current source stimulus described in FIG. 7. Specifically, the stimulus 902 comprises a current-output DAC 904 coupled to a main current branch 920, and two output branches 922 and 924 coupled to positive and negative branches of the differential circuit respectively. The DAC 904 generates a current $I_T$ that is identically mirrored on the two output branches 922 and 924, each output branch having a cascoded current mirror. The output branches 922 and 924 mirrors the current of the main current branch 820. These two identical currents $I_T$ are injected at nodes P and N to impose common mode stimulus to $V_P$ and $V_N$ at nodes P and N respectively just like in the scheme shown on the right of FIG. 7. The impedance imbalance can be compensated for as in FIG. 6.

Before the main DAC 906 can be operated for signal generation and processing, the digitally controlled impedance $Z_T$ 942 is set to balance the differential impedance at the PN port. First, the digital input of the main DAC 906 is set so its output is nominally at mid-scale. In this condition, if PN is balanced and if the nominal DAC output is meant to give a zero differential voltage at the PN port ($V_d$=0), then $V_P$=$V_N$ and $V_\varepsilon$ is expected to be zero. However, if either one or both the prior conditions is violated then the PN port would develop a non-zero differential output ($|V_d|>0$) and that can be compensated for. If desired, this scheme can also be used to zero out a mid-rise/mid-thread scale DAC, namely one that has a non-zero offset at mid-scale.

The common mode stimulus can be exercised with stimulus 902 having a stimulus DAC 904 and current mirrors as it was done for the prior embodiment with the ADC 806 and stimulus 802 as in FIG. 8. The resulting differential error $V_\varepsilon$ can either be sensed by means of the signal processing stages cascaded after the PN port (not shown in this picture). Or, with an additional sense ADC 908 shown in FIG. 9 that can be connected to nodes P and N to measure $V_\varepsilon$ and guide the search performed by adjust logic block 910 to the proper setting $Z_T$ 942. In other words, the sense ADC 908 can provide a measurement of $V_\varepsilon$ to adjust logic block 910, and adjust logic block 910 can implement a method to generate a proper control signal CTRL (e.g., a digital word) to set the digitally controlled impedance $Z_T$ 942. As mentioned, the need for this sense ADC 908 and the nodes to which the sense ADC 908 is connected can be discretionary. Accordingly, FIG. 9 shows the corresponding connections with dashed line.

Additionally and depending on circumstances, it may be more appropriate to rebalance the impedance at the direct output of the main DAC 906, namely upstream from $Z_T$ 942, rather than at the port PN. In the latter case, the sense ADC may be connected right at the main DAC 906's output terminals, on the left hand side of $Z_T$. In that case the set up algorithm for $Z_T$ is still unchanged although it may likely result into a slightly different final value for $Z_T$.

Once $Z_T$ 942 is set, the sense ADC 908 and the stimulus DAC 904 can be turned off and the differential circuit is ready to operate as intended and benefits of the achieved impedance balance.

On-Situ Measurement and Correction Scheme

On-situ measurement and on-situ correction for impedance imbalance is distinguishable from measuring impedance in a laboratory setting. Measuring impedance imbalance in a laboratory setting on a set of test boards would not be able to account for manufacturing or process variations of devices and PCBs that could cause the amount of impedance imbalance to differ. Such kind schemes would also need to know how and where the devices will be mounted and used, which is not always practical or possible. Also, such laboratory measurements may not be able to accurately characterize impedance imbalance over voltage, and temperature. It may also be difficult to characterize the impedance imbalance over a wide range of signal frequencies.

In contrast, an on-situ measurement and on-situ correction scheme can be implemented using circuits and logic on-chip in a device on the board. On-chip means that the circuits and logic for impedance imbalance and measurement are provided in the same chip package (e.g., in the same IC, on the same substrate) as the rest of the device. Such scheme can be used to measure and compensate for the impedance imbalance present in a differential circuit formed by devices in the board. For instance, the differential circuit can include a differential signal path, i.e., a positive branch and a negative branch, for carrying a differential signal between two devices interfacing with each other via a PN port. A routine on-chip can be initiated with one or more parameters (e.g., such as signal frequency of interest) to before the devices are put into normal operation. The parameter(s) can be predetermined, measured, and/or provided/selected by another device. Both the measurement and correction scheme are implemented using circuits already provided on-chip with the device. Furthermore, the routine on-chip can run again by taking the devices offline momentarily to measure and correct for impedance imbalance, in some cases, based on different parameter(s).

The on-situ scheme being provided on-chip with a device means that the device being mounted on a customer board would be able to account for impedance imbalance that the device would encounter and consequently perform better without prior knowledge about the customer board. The device having the on-chip measurement and correction scheme can enjoy the better performance wherever it goes without requiring other devices to account for the impedance imbalance.

In some embodiments, a method for measuring and correcting impedance imbalance comprises generating a common mode stimulus on-chip with a first device. For instance, a common mode stimulus can be generated on-chip by stimulus 802 of FIG. 8 or stimulus 902 of FIG. 9. The stimulus can be provided on-chip with a data converter, such as ADC 806 of FIG. 8 and main DAC 906 of FIG. 9. By providing a circuit on-chip with the first device, the measurement and compensation scheme can occur on-situ. The method further includes applying the common mode stimulus to differential signal paths interfacing between the first device and a second device. The stimulus can be applied in the manner described in the description accompanying FIGS. 7-9. The method further includes sensing an error voltage of the differential signal paths as a result of the common mode stimulus and the impedance imbalance of the differential signal paths. Circuit on-chip can be provided to sense the error voltage on-situ. The method further includes setting a digitally controllable impedance on the first device on one of the differential signal paths based on the error voltage to reduce the impedance imbalance. With the digitally controllable impedance built into the balanced circuit, the impedance imbalance can be compensated on-situ.

In some embodiments, a first integrated circuit interfaces with a second integrated circuit, in a manner as illustrated by Block 101 and Block 102 of FIG. 1. The first integrated circuit includes a controllable impedance in one of two branches of a differential circuit formed by the first integrated circuit and a second integrated circuit, a stimulus circuit for generating and applying a common mode stimulus to the differential circuit, and an adjust logic block for controlling the controllable impedance based on an error voltage of the differential circuit developed from the common mode stimulus and impedance imbalance of the differential circuit. These parts of the integrated circuit enables on-situ imbalance measurement and correction. Examples of such a first integrated circuit are shown in FIGS. 8 and 9.

In some embodiments, an apparatus comprises means for applying a common mode stimulus to branches of a balanced circuit. Examples of the means for applying a common mode stimulus can include stimulus test source $V_T$ 608 of FIGS. 6 and 7, current stimulus sources $I_T$ 702 and 704 of FIG. 7, stimulus 802 of FIG. 8, and stimulus 902 of FIG. 9. The apparatus can further include means for sensing an error voltage caused by the common mode stimulus. Examples of the means for sensing an error voltage can include ADC 806 of FIG. 8 and sense ADC 908 of FIG. 9. The apparatus can further include means for adjusting impedance on one of the two branches based on the error voltage to compensate for impedance imbalance of the balanced circuit. Examples of the means for adjusting the impedance can include adjust block 810 of FIG. 8 and adjust block 910 of FIG. 9.

EXAMPLES

Example 1 is a method for measuring and correcting impedance imbalance, the method comprising: injecting a common mode stimulus to a two-terminal port interfacing between two devices; sensing an error voltage developed across terminals of the two-terminal port of as a result of the common mode stimulus and the impedance imbalance; setting a digitally controllable impedance coupled to one of the terminals based on the error voltage to reduce the impedance imbalance.

In Example 2, the method of Example 1 can be performed when the two devices are mounted on a printed circuit board, and prior to operating a resulting assembled signal chain formed by the two devices.

In Example 3, the method of Example 1 or 2 can include injecting the common mode stimulus comprising injecting a current to each terminal of the two-terminal port.

In Example 4, the method of any one of the above examples can include sensing the error voltage comprising sensing the two-terminal port by a sensing analog-to-digital converter.

In Example 5, the method of any one of the above examples can include setting the digitally controllable impedance comprising determining one or more components which reduces the error voltage using a binary search algorithm.

In Example 6, the method of Example 5 can include the one or more components being resistive and reactive components of the digitally controllable impedance.

In Example 7, the method of any one of the above examples can include setting the digitally controllable impedance comprises determining a setting for the digitally controllable impedance which zeroes out the error voltage.

Example 8 is a system for measuring and correcting impedance imbalance, the system comprising a first device having a two-terminal port interfacing with a second device, a stimulus circuit for generating and injecting a common mode stimulus to the two-terminal port, a sensing circuit for sensing an error voltage developed across terminals of the two-terminal port of as a result of the common mode stimulus and the impedance imbalance, a digitally trimmable impedance coupled to one of the terminals, and logic for controlling the digitally trimmable impedance based on the error voltage from the sensing circuit.

In Example 9, the system of Example 8 can include the first device providing an analog signal on the two-terminal port, and the second device being an analog-to-digital converter which digitizes the analog signal.

In Example 10, the system of Example 8 or 9 can include the sensing circuit being an analog-to-digital converter in the second device.

In Example 11, the system of Example 8 can include the first device comprising a digital-to-analog converter for generating an analog signal on the two-terminal port.

In Example 12, the system of Example 8 or 11 can include the sensing circuit being digital processing circuitry in the second device.

In Example 13, the system of any one of Examples 8-12 can include the first device and the second device being mounted on a printed circuit board, and the logic operates prior to a normal operation of a signal chain formed by the first and second devices.

In Example 14, the system of any one of Examples 8-13 can include the sensing circuit being a sensing analog-to-digital converter.

In Example 15, the system of Example 14 can include the sensing analog-to-digital converter being coupled to the two-terminal port.

In Example 16, the system of Example 14 can include the sensing analog-to-digital converter being coupled to outputs of a digital-to-analog converter in the first device.

In Example 17, the system of any one of the Examples 8-16 can include the stimulus circuit comprising digitally controlled current sources coupled to the two-terminal port for injecting substantially identical currents to respective terminals of two-terminal port as the common mode stimulus.

In Example 18, the system of any one of the Examples 8-17 can include the stimulus circuit being on-chip with the first device.

In Example 19, the system of any one of the Examples 8-18 can include the stimulus circuit being on-chip with the second device.

In Example 20, the system of any one of the Examples 8-19 can include the logic implementing a binary search algorithm to determine one or more components for the digitally trimmable impedance which zeroes out the error voltage.

Example 31 is a method for measuring and correcting impedance imbalance, the method comprising: generating a common mode stimulus on-chip with a first device; applying the common mode stimulus to differential signal paths interfacing between the first device and a second device; sensing an error voltage of the differential signal paths as a result of the common mode stimulus and the impedance imbalance of the differential signal paths; and setting a digitally controllable impedance on the first device on one of the differential signal paths based on the error voltage to reduce the impedance imbalance.

In Example 32, the method of Example 31 can further include applying the common mode stimulus comprising injecting a same current to each one of the differential signal paths at a two-terminal port connecting the first and second device.

In Example 33, the method of Example 31 or 32 can further include setting the digitally controllable impedance comprising determining one or more components which minimizes the error voltage using a search method.

In Example 34, the method of any one of Examples 31-33 can further include setting the digitally controllable impedance comprising determining a setting for the digitally controllable impedance which zeroes out the error voltage.

In Example 35, the method of any one of Examples 31-34, can further include setting the digitally controllable impedance comprising determining resistive and reactive components of the digitally controllable impedance.

In Example 36, the method of any one of Examples 31-35, can further include applying the common mode stimulus comprising applying a direct current stimulus for measuring a resistive component of the digitally controllable impedance.

In Example 37, the method of any one of Examples 31-36 can further include applying the common mode stimulus comprising applying an alternating current stimulus for measuring a reactive component of the digitally controllable impedance.

In Example 38, the method of any one of Examples 31-37 can further include wherein generating the common mode stimulus comprises: generating a digitally controlled current using a digital-to-analog converter; and mirroring the digitally controlled current using two current mirrors coupled to the differential signal paths.

Example 39 is a first integrated circuit interfacing with a second integrated circuit, the first integrated circuit comprising: a controllable impedance in one of two branches of a differential circuit formed by the first integrated circuit and a second integrated circuit; a stimulus circuit for generating and applying a common mode stimulus to the differential circuit; and an adjust logic block for controlling the controllable impedance based on an error voltage of the differential circuit developed from the common mode stimulus and impedance imbalance of the differential circuit.

In Example 40, the first integrated circuit of Example 39 can further include a sensing circuit coupled to the differential circuit for measuring the error voltage of the differential circuit and providing the error voltage to the adjust block.

In Example 41, the first integrated circuit of Example 40 can further include the sensing circuit being an analog-to-digital converter for digitizing the error voltage developed on the two branches of the differential circuit.

In Example 42, the first integrated circuit of any one of Examples 39-41 can further include an analog-to-digital converter for receiving and digitizing signals generated by the second integrated circuit and provided to the first integrated circuit on the two branches of the differential circuit, wherein the analog-to-digital converter further senses the error voltage developed on the two branches of the differential circuit when the stimulus circuit applies the common mode stimulus.

In Example 43, the first integrated circuit of any one of Examples 39-41 can further include a digital-to-analog converter for generating signals and providing the signals to the second integrated circuit on the two branches of the differential circuit; and a sense analog-to-digital converter for sensing the error voltage, wherein the sense analog-to-digital converter is coupled to the two branches downstream from an output of the digital-to-analog converter.

In Example 44, the first integrated circuit of Example 39 can further include: a digital-to-analog converter for generating signals and providing the signals to the second integrated circuit on the two branches of the differential circuit; and a sense analog-to-digital converter for sensing the error voltage, wherein the sense analog-to-digital converter is coupled to the two branches to the at an output of the digital-to-analog converter and in one of the two branches, the sense analog-to-digital converter is upstream from the controllable impedance.

In Example 45, the first integrated circuit of any one of Examples 39-44 can further include the adjust logic block outputs a digital word for controlling the controllable impedance and varies the digital word to reduce the error voltage of the differential circuit.

In Example 46, the first integrated circuit of any one of Examples 39-45 can further include the first and second integrated circuits being connected through a two-terminal port; and the stimulus circuit being coupled to the two-terminal port and injects a same current stimulus to each one of the two branches at the two-terminal port.

In Example 47, the first integrated circuit of any one of Examples 39-46 can further include the stimulus circuit including a current-output digital-to-analog converter and two current branches mirroring output of the current-output digital-to-analog converter; and the two current branches being coupled to the two branches of the differential circuit respectively.

In Example 48, the first integrated circuit of any one of Examples 39-47 can further include the stimulus circuit generating a direct current stimulus and an alternating current stimulus.

In Example 49, the first integrated circuit of any one of Examples 39-48 can further include the adjust logic block comprising logic for determining one or more components for the controllable impedance which zeroes out the error voltage.

Example 50 is an apparatus comprising means for applying a common mode stimulus to branches of a balanced circuit; means for sensing an error voltage caused by the common mode stimulus; and means for adjusting impedance on one of the two branches based on the error voltage to compensate for impedance imbalance of the balanced circuit.

In Example 51, the apparatus of Example 50 can further include means for carrying out or implementing any one or more parts of the methods of Examples 1-7 and 31-38.

Variations and Implementations

In certain contexts, the features discussed herein can be applicable to medical systems, scientific instrumentation, wireless and wired communications, radar, industrial process control, audio and video equipment, current sensing, instrumentation (which can be highly precise), cable infrastructure, military (e.g., Radar), and other systems where on-situ differential impedance balance error measurement and correction are important to the application.

In the discussions of the embodiments above, any capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure. For instance, the current mirrors can be replaced by other circuits for injecting the correct which can enable the impedance imbalance to be measured. The digitally trimmable impedance can be replaced by other circuits which can correct the impedance imbalance.

Parts of various apparatuses for on-situ differential impedance balance error measurement and correction can include electronic circuitry to perform the measurement and correction functions described herein. In some cases, one or more parts of the apparatus (e.g., the adjust logic block seen in FIGS. 8 AND 9) can be provided by on-chip logic, such as an on-chip processor or on-chip digital signal processing circuit specially configured for carrying out at least a part of the measurement and correction functions described herein. For instance, the circuits may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer medium. In various embodiments, the functionalities, such as a search method for determining the setting for the digitally trimmable/controllable impedance described herein may be implemented in emulation form as software or firmware running within one or more configurable (e.g., programmable) elements arranged in a structure that supports these functions. In some cases, The software or firmware providing the emulation may be provided on non-transitory computer-readable storage medium comprising instructions to allow a processor (e.g., an on-chip microprocessor in a device) to carry out those functionalities.

In one example embodiment, any number of electrical circuits of the FIGURES may be implemented on an IC or chip to be provided/mounted onto a board of an associated electronic device. The IC or chip can be a data converter chip, such as an ADC chip, a DAC chip, receiver chip, transmitter chip, transceiver chip, data processing chip having ADC(s) and/or DAC(s), signal acquisition and processing chip, signal generating chip, etc. The board can be a general circuit board that can hold various components of the internal electronic system of the electronic device and, further, provide connectors for other peripherals. More specifically, the board can provide the electrical connections by which the other components of the system can communicate electrically.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the on-situ differential impedance balance error measurement and correction functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the present disclosure. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to on-situ differential impedance balance error measurement and correction, illustrate only some of the possible functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the present disclosure. Note that all optional features of the apparatus described above may also be implemented with respect to the method or process described herein and specifics in the examples may be used anywhere in one or more embodiments.

What is claimed is:

1. A method for measuring and correcting impedance imbalance, the method comprising:
   generating a common mode stimulus on-chip with a first device;
   applying the common mode stimulus to differential signal paths interfacing between the first device and a second device;
   sensing an error voltage of the differential signal paths as a result of the common mode stimulus and the impedance imbalance of the differential signal paths; and
   setting a digitally controllable impedance on the first device on one of the differential signal paths based on the error voltage to reduce the impedance imbalance.

2. The method of claim 1, wherein applying the common mode stimulus comprises:
   injecting a same current to each one of the differential signal paths at a two-terminal port connecting the first and second device.

3. The method of claim 1, wherein setting the digitally controllable impedance comprises:
   determining one or more components which minimizes the error voltage using a search method.

4. The method of claim 1, wherein setting the digitally controllable impedance comprises:
   determining a setting for the digitally controllable impedance which zeroes out the error voltage.

5. The method of claim 1, wherein setting the digitally controllable impedance comprises:
   determining resistive and reactive components of the digitally controllable impedance.

6. The method of claim 1, wherein applying the common mode stimulus comprises:
   applying a direct current stimulus for measuring a resistive component of the digitally controllable impedance.

7. The method of claim 1, wherein applying the common mode stimulus comprises:
   applying an alternating current stimulus for measuring a reactive component of the digitally controllable impedance.

8. The method of claim 1, wherein generating the common mode stimulus comprises:

generating a digitally controlled current using a digital-to-analog converter; and mirroring the digitally controlled current using two current mirrors coupled to the differential signal paths.

9. A first integrated circuit interfacing with a second integrated circuit, the first integrated circuit comprising:
   a controllable impedance in one of two branches of a differential circuit formed by the first integrated circuit and the second integrated circuit;
   a stimulus circuit for generating and applying a common mode stimulus to the differential circuit; and
   an adjust logic block for controlling the controllable impedance based on an error voltage of the differential circuit developed from the common mode stimulus and impedance imbalance of the differential circuit.

10. The first integrated circuit of claim 9, further comprising:
    a sensing circuit coupled to the differential circuit for measuring the error voltage of the differential circuit and providing the error voltage to the adjust logic block.

11. The first integrated circuit of claim 10, wherein the sensing circuit is an analog-to-digital converter for digitizing the error voltage developed on the two branches of the differential circuit.

12. The first integrated circuit of claim 10, further comprising:
    an analog-to-digital converter for receiving and digitizing signals generated by the second integrated circuit and provided to the first integrated circuit on the two branches of the differential circuit;
    wherein the analog-to-digital converter further senses the error voltage developed on the two branches of the differential circuit when the stimulus circuit applies the common mode stimulus.

13. The first integrated circuit of claim 10, further comprising:
    a digital-to-analog converter for generating signals and providing the signals to the second integrated circuit on the two branches of the differential circuit; and
    a sense analog-to-digital converter for sensing the error voltage, wherein the sense analog-to-digital converter is coupled to the two branches downstream from an output of the digital-to-analog converter.

14. The first integrated circuit of claim 10, further comprising:
    a digital-to-analog converter for generating signals and providing the signals to the second integrated circuit on the two branches of the differential circuit; and
    a sense analog-to-digital converter for sensing the error voltage, wherein the sense analog-to-digital converter is coupled to the two branches at an output of the digital-to-analog converter and in one of the two branches, the sense analog-to-digital converter is upstream from the controllable impedance.

15. The first integrated circuit of claim 9, wherein the adjust logic block outputs a digital word for controlling the controllable impedance and varies the digital word to reduce the error voltage of the differential circuit.

16. The first integrated circuit of claim 9, wherein:
    the first and second integrated circuits are connected through a two-terminal port; and
    the stimulus circuit is coupled to the two-terminal port and injects a same current stimulus to each one of the two branches at the two-terminal port.

17. The first integrated circuit of claim 9, wherein:
    the stimulus circuit includes a current-output digital-to-analog converter and two current branches mirroring output of the current-output digital-to-analog converter; and
    the two current branches are coupled to the two branches of the differential circuit respectively.

18. The first integrated circuit of claim 9, wherein:
    the stimulus circuit generates a direct current stimulus and an alternating current stimulus.

19. The first integrated circuit of claim 9, wherein the adjust logic block comprises:
    logic for determining one or more components for the controllable impedance which zeroes out the error voltage.

20. An apparatus comprising:
    means for applying a common mode stimulus to branches of a balanced circuit;
    means for sensing an error voltage caused by the common mode stimulus; and
    means for adjusting impedance on one of the two branches based on the error voltage to compensate for impedance imbalance of the balanced circuit.

* * * * *